United States Patent
Nguyen et al.

(10) Patent No.: US 6,927,707 B2
(45) Date of Patent: Aug. 9, 2005

(54) METHOD FOR DECODING VARIABLE LENGTH CODES AND CORRESPONDING RECEIVER

(75) Inventors: Hang Nguyen, Clichy-la-Garenne (FR); Pierre Duhamel, Le Plessis Robinson (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/810,567

(22) Filed: Mar. 29, 2004

(65) Prior Publication Data

US 2004/0196166 A1 Oct. 7, 2004

(30) Foreign Application Priority Data

Apr. 2, 2003 (EP) ............................................ 03290826

(51) Int. Cl.$^7$ ............................................ H03M 7/40
(52) U.S. Cl. ........................................ 341/67; 341/65
(58) Field of Search ............................. 341/50, 51, 65, 341/67, 75, 79

(56) References Cited

U.S. PATENT DOCUMENTS

| | | | | |
|---|---|---|---|---|
| 5,572,208 A | * | 11/1996 | Wu ............................. | 341/67 |
| 5,818,369 A | * | 10/1998 | Withers ....................... | 341/107 |
| 6,008,745 A | * | 12/1999 | Zandi et al. .................. | 341/67 |
| 6,043,765 A | * | 3/2000 | Twardowski ................. | 341/65 |
| 6,195,024 B1 | * | 2/2001 | Fallon .......................... | 341/51 |
| 6,552,673 B2 | * | 4/2003 | Webb .......................... | 341/67 |
| 6,734,812 B2 | * | 5/2004 | Lin ............................... | 341/67 |

FOREIGN PATENT DOCUMENTS

EP 0 744 869 11/1996
EP 0 744 869 A2 11/1996

OTHER PUBLICATIONS

M. Park et al, "Joint Source–Channel Decoding for Variable–Length Encoded Data by Exact and Approximate Map Sequence Estimation", IEEE Transactions on Communications, IEEE, Inc. NY, US, vol. 48, No. 1, Jan. 2000, pp. 1–6, XP000912965.

J. Wen et al, "Soft–input of–output decoding of variable length codes", IEEE Transactions on Communications, vol. 50, No. 5, May 20002, pp. 689–692, XP002250048.

(Continued)

*Primary Examiner*—Michael Tokar
*Assistant Examiner*—Linh V Nguyen
(74) *Attorney, Agent, or Firm*—Sughrue Mion, PLLC

(57) ABSTRACT

The present invention relates to a method for decoding Variable Length Codes used to encode data having a predefined type, preferably image or video data, said encoded data consisting in a sequence of codewords belonging to a predefined set of codewords.

According to the present invention, the method comprises the steps of:
  building at least one partial decoded codeword sequence comprising at least two decoded codewords;
  checking if said partial decoded codeword sequence fulfils at least one property intrinsic to said predefined type of data.

8 Claims, 3 Drawing Sheets

OTHER PUBLICATIONS

S. Aign, "Error concealment enhancement by using the reliability outputs of a SOVA in MPEG–2 video decoder", Signals, Systems, and Electronics, 1995, ISSSE '95, Proceedings, 1995 URSI International Symposium on Sand Francisco, USA Oct. 25–27, 1995, NY, NY, IEEE Oct. 25, 1995, pp. 59–62, XP010159178.

L. Guivarch et al, "Joint source–channel soft decoding of Huffman codes with turbo–codes", Data Compression Conference, 2000. Proceedings. DCC 2000 Snowbird, UT, USA, Mar. 28–30, 2000, Los Alamitos, CA, USA IEEE Comput. Soc., US, Mar. 28, 2000, pp. 83–92, XP010377348.

P. Bansal et al, "Improved error detection and localization techniques for mpeg–4 video", Proceedings 2002 International Conference on Image Processing. ICIP 2002, Rochester, NY, Sep. 22–25, 2002, International Conference on Image Processing, NY, NY, IEEE, US, vol. 2 of 3, Sep. 22, 2002, pp. 693–696, XP010608066.

M. Bystrom et al, "Soft decoding for robust video transmission", 200 IEEE Wireless Communications and Network Conference, vol. 1, Sep. 23, 2000, pp. 196–201, XP010532493.

Park, Moonseo, et al., "Joint Source–Channel Decoding for Variable–Length Encoded Data by Exact and Approximate MAP Sequence Estimation," *IEEE Transactions on Communications*, Jan. 2000, pp. 1–6, vol. 48, No. 1.

Wen, Jiangtao, et al., "Soft–Input Soft–Output Decoding of Variable Length Codes," *IEEE Transactions on Communications*, May 2002, pp. 689–692, vol. 50, No. 5.

Bystrom, M., et al., "Soft Decoding for Robust Video Transmission," *IEEE Wireless Communications and Networking Conference*, Sep. 2000, pp. 196–201, vol. 1.

\* cited by examiner

METHOD FOR DECODING VARIABLE LENGTH CODES AND CORRESPONDING RECEIVER

The invention is based on a priority application EP 03 290 826.1 which is hereby incorporated by reference.

BACKGROUND OF THE INVENTION

The present invention relates to a method for decoding Variable Length Codes.

Usual image resp. video compression standards contain spatial resp. spatial and temporal compression. Temporal compression consists in that only the first image or one image at predefined time intervals is entirely encoded, for subsequent images only the difference to the entirely encoded image is encoded. Spatial compression usually consists in that the image is firstly applied a transform compression technology such as discrete cosine transform or wavelets and secondly applied an entropy compression technology such as Huffmann code, arithmetic code RVLC or U-VLC all belonging to the family of Variable Length Codes. The step of entropy compression will be the framework for the present invention.

A Variable Length Code comprises a plurality of codewords which are transmitted on a transmission channel to a receiver. At receiver side, the codeword dictionary is known, and the decoder separate the codewords out of the bit stream to recover originally transmitted data. A drawback of this usual decoding method is that transmission errors can propagate spatially until the decoder detects that it cannot find any codeword matching the received sequence and until the next synchronization sequence is found.

Actually, Variable Length Codes decoding method require a reliable transmission channel to be efficient. In mobile communication networks, bit errors due to non-reliable transmission medium can result in a loss of synchronization when decoding codewords. Moreover, due to real time constraints, it is not possible to protect the transmitted data with an error correction mechanism (e.g. radio link protocol) which triggers the repetition of erroneous data frames.

Known in the art are decoding methods for Variable Length Codes based on the projection of the received sequence on the codeword dictionary. Such methods are described in following articles:

On Variable Length Codes for Iterative Source-Channel Decoding, R. Bauer, J. Hagenauer, Proceedings of IEEE Data Compression Conference, 2001, page(s): 273–282.

Iterative Source-Channel Decoding based on a Trellis representation for Variable Length Codes, R. Bauer, J. Hagenauer, ISIT 2000, June 25–30, Sorrento, Italy.

These methods exploit the relationship between bits inside the codeword. However, the relationship is not strong enough to recover efficiently errors at the receiver. Moreover, the decoded sequences may lead to not meaningful codeword sequences even if the decoding of each codeword taken individually seems correct.

A particular object of the present invention is to provide an improved method for decoding Variable Length Codes especially in communication networks having a non-reliable transmission medium.

Another object of the invention is to provide a receiver for performing this method.

SUMMARY OF THE INVENTION

These objects are achieved by a method for decoding Variable Length Codes used to encode data having a predefined type, preferably image or video data, said encoded data consisting in a sequence of codewords belonging to a predefined set of codewords, said method comprising the steps of:
building at least one partial decoded codeword sequence comprising at least two decoded codewords;
checking if said partial decoded codeword sequence fulfils at least one property intrinsic to said predefined type of data.

These objects are further archieved by a receiver for receiving data encoded with a Variable Length Code, said receiver comprising:
means for building at least one partial decoded codeword sequence comprising at least two decoded codewords;
means for checking if said partial decoded codeword sequence fulfils at least one property intrinsic to said predefined type of data.

According to the present invention, the method for decoding Variable Length Codes comprises a step of taking into account constraints on the type of data which are encoded additionally to constraints intrinsic to each codeword.

In a first preferred embodiment of the present invention, the method consists in computing iteratively partial decoded codeword sequences by adding at each iteration an additional plausible codeword. For each partial decoded codeword sequence, a metric giving an information on the meaningfulness of a sequence of data of the predefined type is computed. Among all partial decoded codeword sequences having the same number of bits, only the partial decoded codeword sequence which optimize the metric (herein called survivor) is kept for the next iteration.

Preferably, the metric consists in a Viterbi metric.

Preferably, a likelihood is computed for each bit of the survivor depending on the partial decoded codeword sequences having the same bit length as the survivor. This likelihood is used to generate soft outputs at the decoder output.

In further preferred embodiments of the present invention, properties intrinsic to image or video data are used to check the correctness of partial decoded codeword sequences.

The method according to the present invention presents the advantage to provide an increased robustness to non-reliable transmission channel errors without any bit rate increased due to redundancy and without changes at the encoding side.

The method according to the present invention can be used for all type of source decoding (hard input/hard output, hard input/soft output, soft input/hard output, soft input/soft output).

The method according to the present invention has the advantage to present a computation complexity equivalent to other prior art decoding algorithms while providing better results in term of erroneous decoded codeword sequences.

Further advantageous features of the invention are defined in the dependent claims.

BRIEF DESCRIPTION OF THE DRAWINGS

Other characteristics and advantages of the invention will appear on reading the following description of a preferred embodiment given by way of non-limiting illustrations, and from the accompanying drawings, in which.

DETAILED DESCRIPTION OF THE INVENTION

Figure 1A:
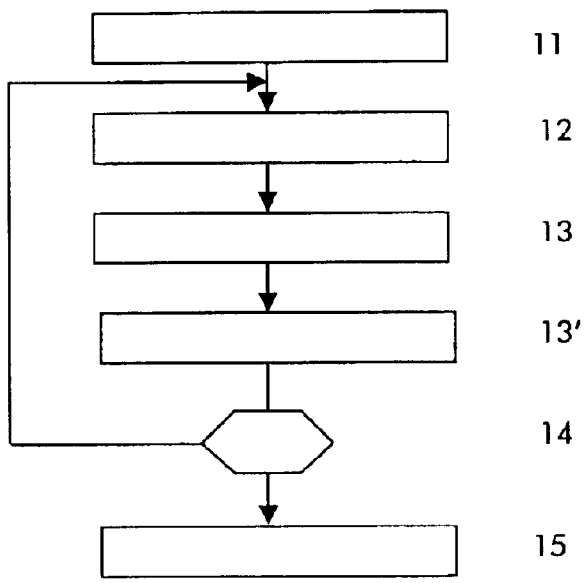
FIG. 1a shows an illustration of a first embodiment of the method according to the present invention.

FIG. 1a shows an illustration of a first embodiment of the method according to the present invention.

This first embodiment of the method according to the present invention consists in iteratively building lists of plausible decoded partial codeword sequences and selecting for further processing some of the partial decoded codeword sequences according to property intrinsic to the predefined type of data. This first embodiment of the method according to the present invention comprises following steps.

Step 11 consists in building a list comprising all plausible partial decoded codeword sequences comprising one codeword belonging to the dictionary and corresponding to the received data bits. The codewords are generated according to usual Variable Length Code decoding algorithms (e.g. H261, H263, H26L, H264, JPEG, MPEG . . . or the ones cited in the paragraph prior art of the present description) upon reception of encoded data from the transmission medium. The present invention does not address the way the different codewords are obtained, it will then be clear for persons skilled in the art that any prior art method can be used for this purpose.

Step 12 consists in calculating a metric for the different plausible partial decoded codeword sequences. The metric should give an indication on the meaningfulness of the decoded sequence according to properties intrinsic to the type of transmitted data. Preferably, the metric is a Viterbi metric which associates an Euclidean distance between the received data sequence and the transmitted data sequence. The Viterbi metric gives an indication on the probability that a data sequence having a predefined bit length has been emitted, the received data sequence having the same bit length being known. It will be clear for those skilled in the art that other metrics reflecting the meaningfulness of a data sequence can be used at the place of the Viterbi metric without departing from the scope of the present invention.

Step 13 consists in selecting for further processing among all partial decoded codeword sequences having the same number of bits the one which optimizes the predefined metric. The selected partial decoded codeword sequence will be called "survivor" in the following.

Step 14 consists in starting the next iteration by adding one additional codeword to the partial decoded codeword sequences obtained at step 13 and repeating steps 12, 13, 14 until a data block having a predefined bit length is obtained (step 15).

Figure 1B:
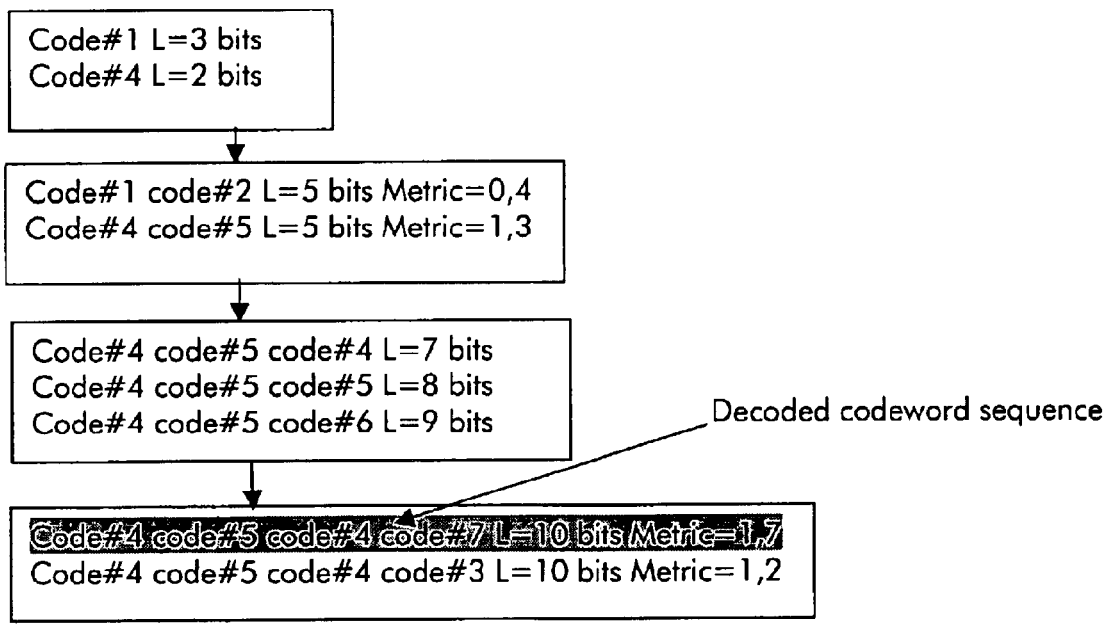
FIG. 1b details a simplified example of the method according to the present invention.

FIG. 1b details the steps listed above for a simplified example. For example, the received data sequence is

| 0 | 1 | 0 | 1 | 1 | 0 | 1 | 1 | 0 | 0. |

It is assumed that this sequence correspond to one data block of bit length equal to 10 bits.

The dictionary comprises following codewords,

| | | | | |
|---|---|---|---|---|
| code #1: | 0 | 1 | 0 | |
| code #2: | 1 | 1 | | |
| code #3: | 0 | 0 | | |
| code #4: | 0 | 1 | | |
| code #5: | 0 | 1 | 1 | |
| code #6: | 0 | 1 | 1 | 0 |
| code #7: | 1 | 0 | 0. | |

The first list of plausible partial decoded codeword sequences comprising only one codeword comprises two entries code #1 and code #4. These two codeword have different bit lengths 3 bits resp. 2 bits. No selection is made according to step 12.

The list of plaussible partial decoded codewords sequences comprising two codewords comprises also two entries:

Code #1 code #2

Code #4 code #5

Since these two partial decoded codeword sequences have the same number of bits (5 bits), a selection of one of these codeword has to be performed according preferably to the Viterbi metric. Only the partial decoded codeword sequence optimizing the metric will be kept for further processing. Assumed the partial decoded codeword sequence optimizing the metric is the sequence: code #4 code #5. At next iteration, the list of plausible partial decoded codeword sequences comprising three codewords comprises three entries Code #4 code #5 code #4

Code #4 code #5 code #5

Code #4 code #5 code #6.

None of these sequences have the same number of bits, no selection is performed

At next iteration, the list of plausible partial decoded codeword sequences comprising four codewords comprises Code #4 code #5 code #4 code #7

Code #4 code #5 code #5 code #3

Code #4 code #5 code #6 code #X would be a codeword sequence comprising at least 11 bits and is as a consequence no more a plausible sequence (in this example a data block comprises exactly 10 bits). No codeword sequence comprising 10 bits can be obtained which starts with code #4 code #5 code #6.

Since partial decoded codeword sequence code #4 code #5 code #4 code #7 and partial decoded codeword sequence code #4 code #5 code #5 code #3 comprises the same number of bits, the metric is used to select the partial decoded codeword sequence which optimize the viterbi metric. Since the bit length of the partial decoded codeword sequence equals the bit length of a data block, the decoding of this data block is finished.

In a preferred embodiment of the present invention, additional partial decoded codeword sequences are kept for further processing at each iteration. This presents the advantage to provide a better correct decoding rate with an acceptable increase of the processing load. These additional partial decoded codeword sequences kept for further processing are chosen as described below.

For each survivor of bit length L, an information related to the number of pixels coded in this survivor is computed. This information is preferably, the sum of the run parameters for each codewords contained in the survivor.

Then, for all other partial decoded codeword sequences having the same bit length as the survivor of bit length L, the information related to the number of pixels coded in the partial decoded sequence (e.g. the sum of the "run" parameters for the codewords in the partial decoded codeword sequence) is also computed and noted R.

All partial decoded codeword sequences having an information related to the number of pixels coded in the partial decoded codeword sequence lower than R are kept for the next iteration.

Alternatively, among the partial decoded codeword sequences having an identical information related to the number of pixel coded, only the partial decoded codeword sequence which optimises a likelihood as defined below is kept for further processing.

Preferably, the method comprises a step 13' of computing a likelihood for each bits of the survivors at each iteration. The likelihood is preferably a function of the metrics computed for the partial decoded codeword sequences having the same bit length as the survivor. This likelihood is used to generate soft outputs at the decoder output. It will be understood by those skilled in the art that this step is optional especially if hard outputs are generated at the decoder output.

The likelihood can preferably be calculated the following way:

First, a quantity called "marginal" associated to the "survivor" is computed for each bit. This quantity takes into account all partial decoded codeword sequences which have to be discarded and which have the same bit length as the survivor.

$$\text{marginal}(X_i = 1) = \sum_{S_p \in \text{Set of {candidates to be discarded, survivor}}/X_i=1} B_{i,1}(S_p/Y_p)$$

$$\text{marginal}(X_i = 0) = \sum_{S_p \in \text{Set of {candidates to be discarded, survivor}}/X_i=1} B_{i,0}(S_p/Y_p)$$

with:

$X_i$ the i-e bit of the sequence to be decoded $S_p$ the plausible partial decoded codeword sequence of the k-e list $L_k$ before discarding all the candidates which are not the survivor.

$Y_p$ the received data sequence corresponding to the sequence $S_p$.

By construction, $S_p$ is created with a sequence from the previous iteration list $L_{k-1}$: $S'_p$ and a new added codeword $V_{new}$: $S_p = S'_p V_{new}$ L is the length in bits of $S_p$ and L' is the length in bits of $S'_p$.

then $\forall i \in [1, L']$:

$$B_{i,x_i}(S_p/Y_p) = \text{old-marginal-of-}S'_p(X_i) * P(V_{new}/Y_{vlc})$$

$Y_{vlc}$ is the received sequence corresponding to this codeword.

$\forall i \in [L'+1, L]$ if the corresponding bit of $S_p$ is equal to $X_i = x$ with $x \in \{0,1\}$, then:

$$B_{i, X_i=x}(S_p/Y_p) = [\text{old–marginal-of-}S'_p(X_{L'}=0) + \text{old-marginal-of-}S'_p(X_{L'}=1)] * P(V_{new}/Y_{vlc})$$

if the corresponding bit of $S_p$ is equal to $X_i \neq x$ with $x \in \{0,1\}$, then:

$$B_{i,x_i=x}(S_p/Y_p) = 0$$

At the end of the iteration process, the "marginal" quantity associated to the last survivor is the sum of all the discarded complete plausible sequence and the former associate "marginal" quantity of the survivor itself.

The "marginal" is a quantity which is used to get a "soft-output" at the decoder output.

The "soft-output" is then preferably computed for each bit the following way.

$$L(X_i) = \frac{P(X_i = 1)}{P(X_i = 0)} = \frac{\sum_{\text{over all the sequences in the list } F} \text{marginal}(X_i = 1)}{\sum_{\text{over all the sequences in the list } F} \text{marginal}(X_i = 0)}$$

$$P(X_i = 1) = \frac{\sum_{\text{over all the sequences in the list } F} \text{marginal}(X_i = 1)}{\sum_{\text{over all the sequences in the list } F} \text{marginal}(X_i = 1) + \sum_{\text{over all the sequences in the list } F} \text{marginal}(X_i = 0)}$$

$$P(X_i = 0) = \frac{\sum_{\text{over all the sequences in the list } F} \text{marginal}(X_i = 0)}{\sum_{\text{over all the sequences in the list } F} \text{marginal}(X_i = 1) + \sum_{\text{over all the sequences in the list } F} \text{marginal}(X_i = 0)}$$

In further preferred embodiments of the present invention Log-" and "Sub-log" approximations can be used to generate "soft outputs" at the decoder output.

"Sub-log" is an sub-optimum algorithm of this algorithm with the approximation $\log(e^a + e^b) = \max(a,b)$ to be used in Viterbi algorithm.

"Log-" is another sub-optimum algorithm of this algorithm with the approximation in the Viterbi algorithm:

$$\log(e^a + e^b) = \max(a,b) + \log(1 + e^{-|a-b|})$$

where $\log(1 + e^{-|a-b|})$ is given by a table.

For these two sub-optimum algorithms, multiplication operations become addition operations and no exponential function values computation have to be performed (if the errors model is AGWN).

Figure 2:
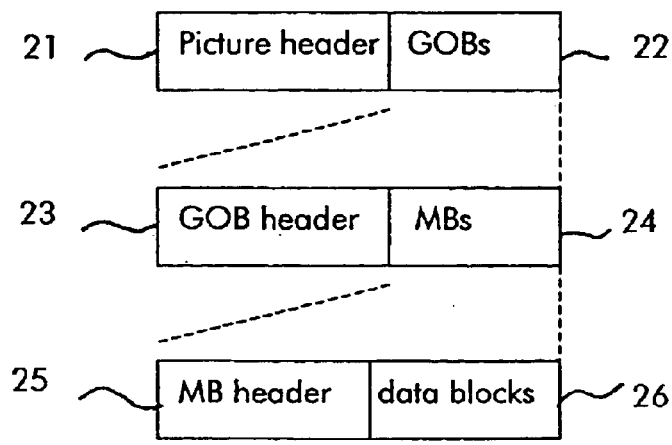
FIG. 2 shows the hierarchical organization of video bit stream used in a second embodiment of the method according to the present invention to determine data type specific properties.

FIG. 2 shows the hierarchical organization of video bit stream used in a second embodiment of the method according to the present invention to determine data type specific properties. For each picture, the image or video data comprise a picture header 21 followed by groups of blocks 22

(GOB), each group of blocks 22 comprises a GOB header 23 and macro blocks 24 (MB), each MB 24 comprises a MB header 25 and data blocks 26. A data block 26 contains a predefined number of pixels N. (e.g. 64 pixels in the case of the H.263).

Each codeword generated by the encoding of a data block 26 is represented by a triplet (run, level, last) as described in H263 standard or by a couple (run, level) together with an End-of-Block indicator as described in the H.26L standard. Other prior art encoding mechanism may be used without departing from the scope of the present invention (e.g. MPEG, JPEG, H261, H264 . . . ). The parameter run represents the number of pixels encoded in a codeword.

According to the invention, partial decoded codeword sequences representing a data block should verify following property:

$$\sum_{\substack{codewords \in \\ partial\ sequence}} run_{codeword} + 1 \leq N$$

wherein the parameter "run as defined in "run-length" compression methods is associated to each codeword. The parameter "run" is related to the number of pixels coded in a codeword.

Indeed, a partial decoded codeword sequence for which the above mentioned sum would be greater than the number of pixel per data block would be an erroneous partial decoded codeword sequence.

This property intrinsic to the type of data can be used alone in that a sequence of decoded codeword can be rejected if it does not fulfil the property. In this case, another decoding algorithm (e.g. a more efficient one) should be used to decode the received sequence.

Alternatively, this property can be used in combination with the decoding method proposed in the first embodiment of the present invention. In this case, each partial decoded codeword sequence is checked against this property and partial decoded codeword sequences which do not fulfil the property are discarded. This presents the advantage to further reduce the processing load in the decoding method according to the first embodiment of the present invention.

In a further embodiment of the present invention, the field last from the triplet (run, level, last) according to H263 standard, respectively the End-of-Block indicator according to H.26L standard are used to define a property intrinsic to the type of data. Indeed, the field "last" or "end of block" is only set to 1 if the corresponding codeword is the last codeword of the data block. In all other cases (i.e. the decoded codeword is not the last of the data block), the field "last" or "end of block" must be 0.

This property intrinsic to the type of data can be used alone in that a sequence of decoded codeword can be rejected if it does not fulfil the property. In this case another decoding of the received sequence should be performed.

Alternatively, this property can be used in combination with the decoding method proposed in the first embodiment of the present invention. In this case, each partial decoded codeword sequence is checked against this property and partial decoded codeword sequence which do not fulfil the property are discarded. This presents the advantage to further reduce the processing load in the decoding method according to the first embodiment of the present invention.

Preferably the method according to the present invention in its different embodiment is used for the transmission of image or video data over wireless communication network having per se an unreliable transmission medium.

Figure 3:
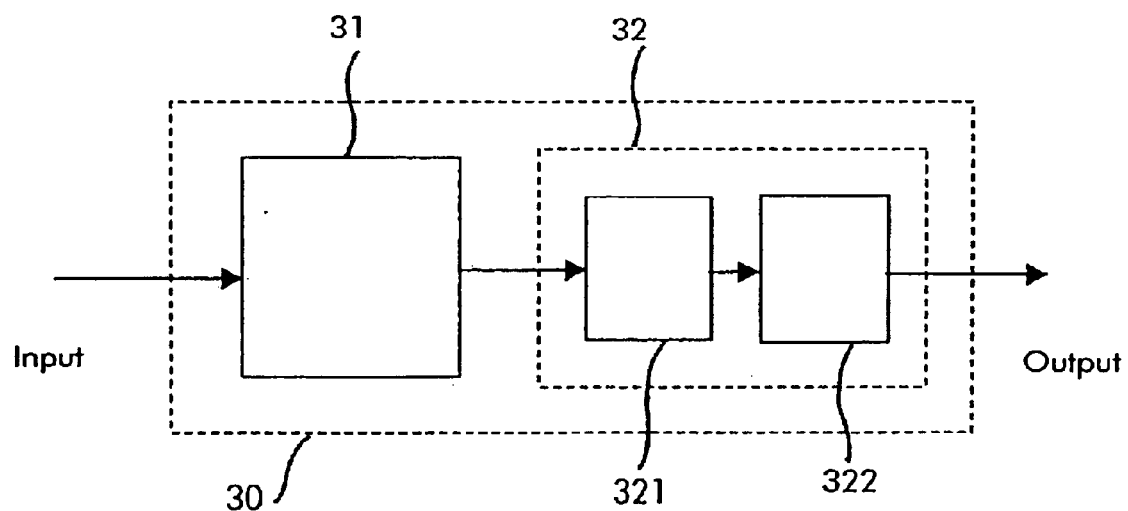
FIG. 3 shows a receiver according to the present invention.

FIG. 3 shows a receiver according to the present invention.

The receiver comprises a decoder 30 for decoding Variable Length Codes. Decoder 30 comprises a module 31 for decoding Variable Length Codes as known in prior art and a module 32 for checking if decoded sequences fulfil a predefined property intrinsic to the type of encoded data.

Module 31 generates codewords according to usual Variable Length Code decoding algorithms (e.g. H261, H263, H26L, H264, JPEG, MPEG . . . ) upon reception of encoded data from the transmission medium. Module 31 forward each new decoded codeword to module 32. Module 32 comprises means 321 for building partial decoded codeword sequences comprises at least two decoded codewords, means 322 for checking if the partial decoded codeword sequences fulfils one or more properties intrinsic to the type of data to decode.

In a preferred embodiment, means 322 checks if the partial decoded codeword sequence optimize a metric calculated for data sequences having a predefined bit length. This metric is preferably the Viterbi metric. Means 322 then only keep for further processing the partial decoded codeword sequence which optimize the Viterbi metric among the partial codeword sequences having the same bit length.

In another preferred embodiment means 322 checks is the partial decoded codeword sequence fulfills following property $$\sum_{\substack{codewords \in \\ partial\ sequence}} run_{codeword} + 1 \leq N$$

In a further preferred embodiment of the present invention means 322 checks if the partial decoded codeword sequence fulfills following property:

$$last_{last\ codeword\ of\ data\ sequence} \neq 1.$$

The receiver according to the present invention can be a mobile terminal. Alternatively, the receiver can be a part of the base station subsystem in the case that the encoded data are decoded at the base station subsystem.

Figure 4:
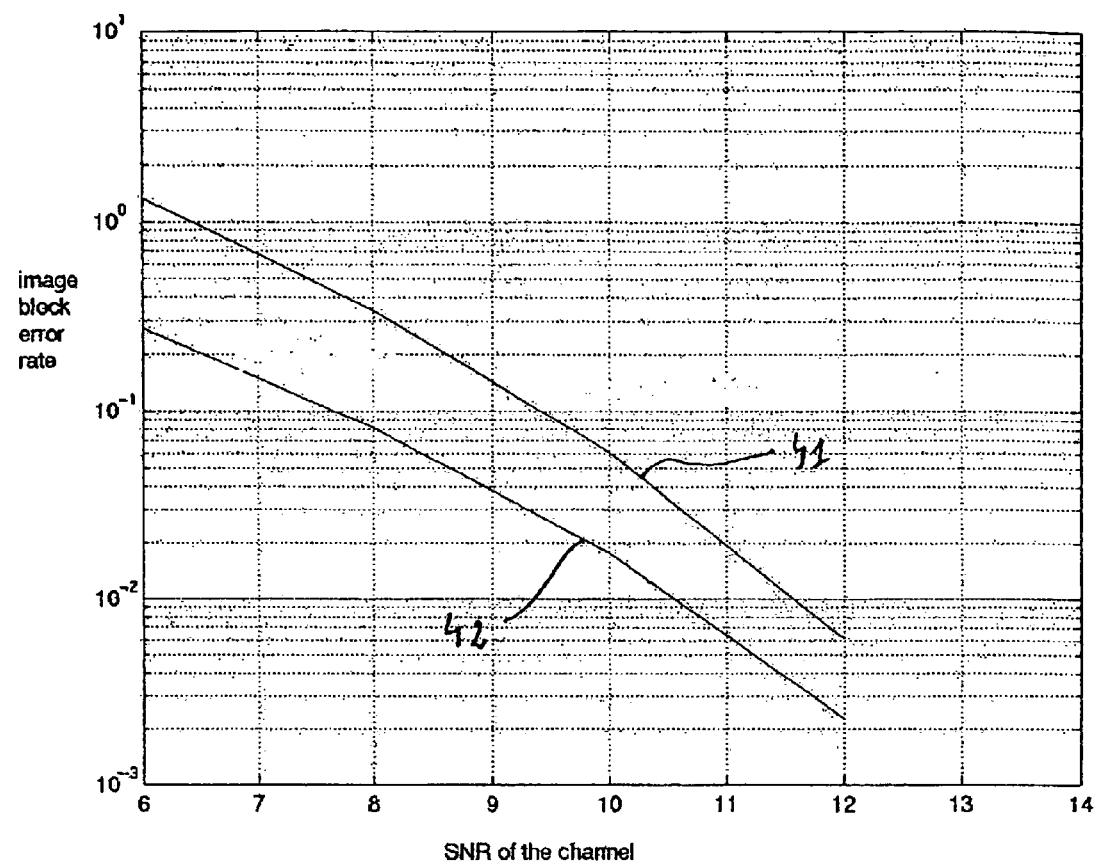
FIG. 4 represents simulation results obtained using the second embodiment of the present invention.

FIG. 4 represents simulation results obtained using the second embodiment of the present invention. A set of image blocks from video sequences have been used for simulation. This set of image blocks have been transmitted over a gaussian (AGWN) channel and have then been decoded according to a prior art decoding method (curve 41) and with the method according to the present invention (curve 42). The curves 41, 42 show the image block error rate (number of image blocks erroneously decoded over total number of transmitted image blocks).

A gain of 1 to 2 dB is obtained with the method according to the present invention.

The above presented simulation results have been obtained when considering the "data" field of the video stream. However, the method of the present invention can also be applied to other fields of the video stream (e.g. header fields, synchronization words, motion vectors . . . ) which may be of fixed length. Indeed fixed length codes used to encode fixed length fields may be considered as a subset of variable length codes.

As a consequence a receiver equipped with a decoder according to the present invention may be used for all fields of the video stream.

What is claimed is:

1. A method for decoding Variable Length Codes used to encode data having a predefined type, preferably image or video data, said encoded data consisting in a sequence of codewords belonging to a predefined set of codewords, said method comprising the steps of:

building iteratively partial decoded codeword sequences by adding at each iteration an additional plausible codeword, the number of partial decoded codeword sequences at each iteration being equal to the number of additional plausible codewords which can be decoded, computing a metric for each obtained partial decoded codeword sequence, said metric giving an information on the meaningfulness of a sequence of data of said predefined type having a predefined bit length; and keeping the partial decoded codeword sequence of said predefined bit length, herein called survivor of bit length L, for optimizing said metric for the next iteration.

2. The method according to claim 1, wherein said encoded data are transmitted over an air interface in a wireless communication network.

3. The method according to claim 1 wherein said predefined type of data are image or video data blocks comprising a predefined number of pixels, further comprising the steps of:

determining at each iteration an information related to the number of pixels coded in said survivor of bit length L;

keeping at least one additional partial decoded codeword sequence, having the same bit length as said survivor of bit length L, for which said information related to the number of pixel coded in said partial decoded sequence is lower than said corresponding information for said survivor of bit length L.

4. The method according to claim 1, further comprising the steps of:

computing a likelihood for each bit of said partial decoded codeword sequence kept for next iteration, herein called survivor, as a function of partial decoded codeword sequences having the same bit length as said survivor; and generating a soft decoding output as a function of said likelihood.

5. The method according to claim 1, wherein said data are image or video data blocks comprising a predefined number of pixels, said method further comprising the step of:

rejecting said partial decoded codeword sequence if the sum over the codewords belonging to said partial decoded codeword sequence of parameter values representing the number of pixels encoded in a codeword is greater than the number of pixels per data blocks, noted N, resulting in that following equation is not verified:

$$\sum_{\substack{codewords \in \\ partial\ sequence}} run_{codeword} + 1 \leq N,$$

wherein said parameter "$run_{codeword}$" represents the number of pixels coded in a codeword.

6. The method according to claim 1, wherein said data are image or video data blocks, said method further comprising the step of rejecting said partial decoded codeword sequence if said partial decoded codeword sequence has a bit length smaller than the bit length per data blocks, and the last codeword of said partial decoded codeword sequence comprises a parameter indicating that said codeword is the last of said data block, or said partial decoded codeword sequence has a bit length equal to the number of pixels per data blocks and the last codeword of said partial decoded codeword sequence comprises a parameter indicating that said codeword is not the last of said data block.

7. The method according to claim 5, further comprising the step of discarding said partial decoded codeword sequence if said property is not verified.

8. A receiver for receiving data encoded with a Variable Length Code, said receiver comprising:

means for building iteratively partial decoded codeword sequences by adding at each iteration an additional plausible codeword, the number of partial decoded codeword sequences at each iteration being equal to the number of additional plausible codewords which can be decoded, means for computing a metric for each obtained partial decoded codeword sequence; said metric giving an information on the meaningfulness of a sequence of data of said predefined type having a predefined bit length;

means for keeping the partial decoded codeword sequence of said predefined bit length, herein called survivor of bit length L, for optimizing said metric for the next iteration.

* * * * *